United States Patent [19]

Carson et al.

[11] Patent Number: 4,614,835

[45] Date of Patent: Sep. 30, 1986

[54] PHOTOVOLTAIC SOLAR ARRAYS USING SILICON MICROPARTICLES

[75] Inventors: Kent R. Carson, McKinney; Joseph D. Luttmer, Richardson; Charles E. Williams, Dallas; William R. McKee, Plano; Stephen T. Tso; Elwin L. Johnson, both of Dallas, all of Tex.

[73] Assignee: Texas Instruments Incorporated, Dallas, Tex.

[21] Appl. No.: 562,485

[22] Filed: Dec. 15, 1983

[51] Int. Cl.⁴ ............................................. H01L 31/06
[52] U.S. Cl. ...................................... 136/250; 136/256
[58] Field of Search ......................... 136/246, 250, 256

[56] References Cited

U.S. PATENT DOCUMENTS

| | | | |
|---|---|---|---|
| 3,025,335 | 3/1962 | Ralph | 136/250 |
| 4,116,718 | 9/1978 | Yerkes et al. | 136/246 |
| 4,173,494 | 11/1979 | Johnson et al. | 136/250 |
| 4,454,372 | 6/1984 | Appleby | 136/250 |

*Primary Examiner*—Aaron Weisstuch
*Attorney, Agent, or Firm*—Peter J. Thoma; Douglas A. Sorensen; James T. Comfort

[57] ABSTRACT

The disclosure relates to a photovoltaic solar array which is provided with a matrix having spherical photovoltaic diode particles embedded therein in an ordered array, the P-type region of each particle extending to one matrix surface and the N-type region of each particle extending to an opposed matrix surface. Backside metallization is disposed on the matrix backside surface to interconnect the particles extending thereto and frontside conductors are provided on the opposing matrix surface to interconnect the particles extending thereto. The matrix includes two portions, the first portion being a layer extending to the frontside formed of a clear glass. The second portion of the matrix is, in effect, two layers, one disposed at the P-N junctions of the particles being a lead base glass for junction passivation, this layer being overcoated with a reflective layer to provide additional reflectivity of light entering the matrix onto the particles. This increases the amount of light impinging on the particles. The frontside of the matrix includes a light transparent conductive material with electrically conductive whiskers embedded therein for improved conductivity.

4 Claims, 5 Drawing Figures

CROSS SECTIONAL VIEW OF SOLAR ARRAY

DOTS OF ADHESIVE ON A PLASTIC BACKING

PARTICLES MOUNTED IN FROZEN MEDIA

SMOOTH SURFACE BETWEEN PARTICLES

CONDUCTIVE METAL WHISKERS IN
TRANSPARENT CONDUCTOR COATING

PHOTOVOLTAIC SOLAR ARRAYS USING SILICON MICROPARTICLES

BACKGROUND OF THE INVENTION

1. Field of the Invention

The invention relates to solar arrays of silicon particles cast in glass or transparent plastic that generate electricity.

2. Description of the Prior Art

Systems for producing useful energy by conversion of the rays of the sun to electricity are well known and constantly being developed and improved due to the promising economics of the sun being the primary source of energy involved. Traditionally, these systems have been based upon silicon slices cut from high-purity single crystal boules. The slices are mechanically and chemically polished, diffused to form large area photodiodes, and interconnected as photovoltaic (PV) arrays. Arrays of this kind, however, are expensive. This is because single crystal silicon boules are themselves expensive, kerf loss and polishing wastes 30%–50% of each boule, and a large amount of silicon is required per unit area of array because the slices must be sufficiently thick to survive handling during processing. As a result, the cost per unit kilowatt hour of electrical power output generally exceeds the cost of power purchased from electrical utilities, and the market for such arrays is thus limited to special applications where utility power is not an alternative.

One approach to solving the cost/performance problem is to prepare solar arrays composed of a thin transparent matrix such as glass or plastic embedded with nearly spherical silicon particles, each slightly larger than the matrix thickness and each having regions of both P-type and N-type conductivity. All regions of one conductivity type are electrically connected together (e.g., with metallization on the backside of the array) while all regions of the other conductivity type are independently electrically connected together (e.g., with metallization on the frontside of the array). When irradiated with light, the particles act as an array of discrete photodiodes connected in parallel, and a photovoltage of between 0.45 V and 0.60 V develops between the two common interparticle connections. Several embodiments of array structures based on silicon particles are found in the following U.S. Pat. Nos.: 2,904,613 of M. E. Paradise, 3,025,335 of E. L. Ralph, 3,040,416 of Matlow et al., and 3,998,659 of G. F. Wakefield. Cost/performance of these arrays is potentially superior to that of arrays prepared from single crystal silicon slices since, while both have roughly equivalent theoretical solar-to-electricity conversion efficiency, the silicon particle arrays will be considerably less expensive. This is because the techniques for preparing particles are inherently inexpensive and generate little or no waste. Moreover the three-dimensional nature of the particles and their small size ensures that much less silicon is required per unit area of array to achieve comparable active P-N junction area.

In practice, however, the potential advantages of silicon particle arrays have not been realized in that actual solar-to-electricity conversion efficiencies have typically not exceeded a few percent. The following three factors listed in descending order of importance, have been mainly responsible for limiting efficiency:

shorted particles internally shunt the photocurrent.

series resistance imposed by the metallizations used for inter-particle connections degrades the fill factor.

poor light-gathering characteristics of the array structure degrades the photocurrent.

The seriousness of shorts can be readily understood by means of an example. Assume a 1 $cm^2$ silicon particle array is composed of 500 0.04 cm dia. particles each with a core resistivity of 1.0 $\Omega$-cm and each of which generates an operating current of $50 \times 10^{-6}$ amp in bright sunlight. The array operating current would be $25 \times 10^{-3}$ amp. A shorted particle will represent a shunt resistance of about 34 $\Omega$ and its presence in the array will shunt away about $14.7 \times 10^{-3}$ amp at an operating voltage of 500 mV. This represents an efficiency reduction of 59%.

Kilby et al. in U.S. Pat. Nos. 4,021,323 and 4,100,051 describe a technique for using silicon particle arrays in such a way that the problem of shorts is avoided. The arrays contain both P-type particles with N-type skins and N-type particles with P-type skins embedded in a transparent glass matrix. On the backside of the matrix the core conductivity regions of the particles protrude and are interconnected with appropriate electrically conductive metallization. The skin conductivity regions of the particles protrude from the frontside of the matrix where they are individually coated with films of catalyst metal that are, in turn, in contact with an electrolyte solution. Due to the potential difference set up between the two types of silicon particles under sunlight, the solution is electrolyzed. The reaction products are stored and later recombined in a fuel cell to generate electricity. During electrolysis, each particle acts independently. Shorted particles do not reduce the output of other particles, they simply do not generate reaction products themselves. Although this technique deactivates shorts, it does not provide an optimum solution to the problem. This is because solar-to-electricity efficiency is reduced by the energy losses involved with electrolysis, both N/P and P/N particles are required, more costly corrosion-resistant materials must be used, and encapsulation of the electrolyte above the array surface presents engineering problems. However, this technique may be attractive if the electrolysis can be combined with a requirement for electrical energy storage.

A way to minimize the effect of shorts in silicon particle arrays has been suggested. An aluminum foil is simultaneously thermocompression bonded to one conductivity region of each particle in an array such that a fixed contact resistance in series with each particle is effected. If the incidence of shorted particles is low, by controlling the contact resistance, their effect can be reduced to a minimum with only a slight sacrifice of output power. For example, placing a 400 $\Omega$ resistor in series with each particle in a 1 $cm^2$ array comprising 500 particles each generating $50 \times 10^{-6}$ amp at an operating voltage of 500 mV, would reduce output power by 4% due to $I^2R$ losses in the 400 $\Omega$ resistors and result in only an additional 5% power loss if a shorted particle were present. This technique, however, also does not provide an optimum solution to the problem. Formation of interparticle connections by thermocompression bonding of aluminum foil is not compatible with glass or plastic matrices and appears to be practical only if aluminum foil is used for both connections. Achieving and maintaining the desired contact resistance requires exacting control over the bonding parameters. Moreover, the undesirable $I^2R$ loss is unavoidable, and the technique fails to provide adequate protection against shorted particles if their concentration exceeds about ½%.

While silicon particle solar arrays of the type described above and elsewhere in the art may operate satisfactorily, it is desirable to increase their solar-to-electricity conversion efficiency in order to provide a maximum of electrical energy from a photovoltaic solar array of predetermined dimensions.

Therefore, it is an object of this invention to provide a solar array, comprising silicon particles embedded in a transparent matrix of insulator material, in which shorted particles are isolated by such means that efficiency is increased to the maximum possible extent.

It is an additional object of this invention to provide a solar array consisting of silicon particles embedded in a transparent matrix of insulator material, which is provided with a transparent interparticle connector film such as tin or indium oxide whose conductivity has been increased by the inclusion of metal whiskers.

It is yet a further object of this invention to provide a solar array comprising silicon particles embedded in a transparent matrix of insulator material, in which the surface of the matrix in contact with interparticle connector films is microscopically smooth.

It is a further object of this invention to provide a solar array comprising silicon particles embedded in a transparent matrix of insulator material, in which a light-reflective surface is provided to direct rays of light that have penetrated the matrix between particles back onto the sides of the particles where they can be usefully absorbed.

It is still a further object of this invention to provide a solar array of silicon particles embedded in a transparent matrix of insulator material in which the particles are arranged in a two-dimensional hexagonal close packed arrangement.

SUMMARY OF THE INVENTION

In accordance with the present invention, there is provided a photovoltaic solar array which has improved efficiency relative to prior art arrays. Briefly, there is provided a matrix having spherical photovoltaic diode particles embedded therein in a two-dimensional hexagonal close packed array, the P-type region of each particle extending to one matrix surface and the N-type region of each particle extending to an opposed matrix surface. Backside metallization is disposed on the matrix backside surface to interconnect the particles extending thereto and frontside conductors are provided on the opposing matrix surface to interconnect the particles extending thereto. A conductive grid is formed over the frontside conductors. The matrix includes two portions, the first portion being a layer extending to the frontside formed of a clear glass such as, for example, Corning 7070 glass, which is a borosilicate glass, or a clear plastic, as in the prior art. The second portion of the matrix is, in effect, two layers, the one disposed at the P/N junctions of the particles being a lead base glass, such as Innotech IP745 for junction passivation, this layer being overcoated with a reflective layer, such as IP745 glass including a white opacifier such as $TiO_2$ to provide additional reflectivity of light entering the matrix onto the particles. This increases the amount of light impinging on the particles.

The backside metallization is preferably evaporated and sintered aluminum, the short circuit isolation insulation is preferably reactively sputtered $TaO_2$, the transparent topside conductor is preferably fluorine doped CVD deposited tin oxide ($SnO_2$), the conductive grid is preferably copper and the isolation of shorted particles is preferably accomplished by selective copper plating and lift-off of the $TaO_2$ prior to $SnO_2$ deposition as set forth in Ser. No. 562,782, filed Dec. 16, 1983, this application describing several ways of isolating short circuited particles and being incorporated herein by reference. Of course, there is substantial variation possible in the materials and processes that might be used.

The matrix first portion insulation can be any clear glass whose expansion coefficient approximates that of Si or, even, a range of clear or translucent epoxies or plastics. The passivating layer of the insulating matrix can be plasma deposited or chemical vapor deposition (CVD) deposited insulators or even electrolytically anodized coatings or certain plastics that are effective in the role of junction passivation. This layer may also be constituted of multiple layers of various materials.

Backside metallization may be aluminum or many other metals or alloys such as Ni, Au, TiW, Ta, Cu, etc., the requirement being that the metal make relatively good electrical contact with the silicon particles. The backside metallization may also act as the back reflector if the second portion of the insulating matrix is clear.

The short circuit isolation insulation layer can also be selected from a range of materials such as sputtered $Al_2O_3$ or $SiO_2$, plastic, evaporated $SiO_x$, etc., the only criteria being that it is a reasonably good insulator and reasonably transparent. The transparent topside conductor can be sputtered or CVD deposited $SnO_2$, $In_2O_3$, doped or undoped, or alloys of the two with a variety of possible dopants or very thin metal layers. The conductive grid may be any conductive metal-bearing plastic or epoxy or any of a number of sputtered or evaporated and suitably patterned metals or screened or printed and fired pastes of a wide range of metals. The basic particles may also consist of P-type coated N-type particles rather than the N-type coated P-type particles assumed here (with suitable modification to the materials and processes).

The particles themselves, unlike the prior art, are arranged in the matrix in a two-dimensional hexagonal close packed array. This is accomplished by any one of several techniques. The first of these techniques uses a patterned plastic tape, such as Mylar tape, whereupon dots of adhesive are exposed through a screen printed non-adhesive pattern. Photovoltaic particles are loaded onto the tape, which orders their positions, and they are then transferred directly into the freshly cast glass matrix slurry. The slurry is a mixture of borosilicate glass and a binder such as ethyl cellulose, butyl carbitol or the like, these slurries being known in the art. The adhesive on the Mylar tape holds the photovoltaic particles in their proper positions as the malleable glass matrix slurry is formed around the photovoltaic particles. A second technique is to position the particles in an ordered array on a thin film of wax or ice and pour a cast glass slurry over and between the ordered particles to form a tape. The ice or wax is then melted away and the tape is fired in standard manner. The real advantage of this technique is that the Si protrude slightly from the green glass at time of firing (the particles typically are buried and have to be etched to expose them after firing—etching roughens the glass and the transparent conductor laid over such a surface has 30%–40% higher resistivity than if it is laid over a smooth surface). When fired, the surface of the matrix becomes smooth by surface tension.

The frontside conductors are normally formed of tin oxide, indium oxide, or alloys thereof, either doped or undoped. These materials are not highly conductive, thus requiring the use of a current bussing grid. The conductivity of the frontside conductors is materially increased by mixing fine whiskers of a conductive material therein, such as Ni, Fe, Cr, and the like. Whiskers of metals only a fraction of a micron in diameter and many microns long can be prepared by pyrolytic decomposition. If they are included in the oxide film (e.g. by being held on the array surface at the time of oxide deposition) they will reflect back little light because of their small size but significantly increase the film conductivity. By use of the whiskers, the conductive grid can be eliminated since sufficient conductivity is obtained. Alternatively, grid spacing can be enlarged to provide a decrease in the amount of grid area present to cause reflection of incoming light. The frontside conductor can also be a film of metal such as copper, aluminum, silver, or the like deposited by sputtering, evaporation, electrolytic plating, etc. This is possible because the particles are exposed over a large fraction of their diameter from the frontside of the array (i.e., the matrix material covers only about half the spheres with the rest being exposed). When this is done, and if the particles are packed tightly, the metal covers the matrix on the frontside between the exposed particles and contacts only the edges of the exposed particles. This is accomplished by using the band metal technology described in Ser. No. 562,783, filed Dec. 16, 1983.

DESCRIPTION OF THE PREFERRED EMBODIMENTS

Figure 1:
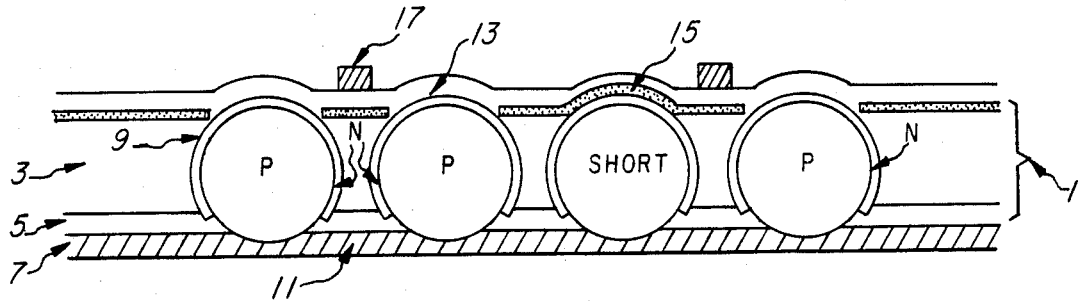
FIG. 1 is a cross-sectional view of a solar array showing a matrix in accordance with the present invention.

Referring first to FIG. 1, there is shown a cross-section of a typical solar array displaying a first feature in accordance with the present invention. The array includes a transparent or translucent matrix 1 including a top portion 3 and a bottom portion composed of layers 5 and 7. The portion 3 is formed of a transparent or translucent material, the layer 5 is formed of a passivating material and the layer 7 is formed of a light reflecting material. Silicon spheres 9 having a P-type interior and an N-type skin which has been removed from the sphere bottom are embedded in the matrix in an ordered array, the skin extending through the matrix top or frontside and the exposed P-type sphere bottom extending through the backside of the sphere. The sphere bottoms are removed by etching the silicon spheres after they have been embedded in the glass matrix, using silicon etching techniques well known in the art. The sphere bottoms are interconnected by metallization 11 on the matrix backside whereas the skins are interconnected by a transparent conductor 13 on the frontside of the matrix except for the short circuited sphere which has been electrically isolated from the rest of the array by the short isolation insulation 15. A current bussing grid 17 is provided to carry electric current generated by the particles and conducted to the grid by the transparent conductor.

In the above described embodiment, sunlight impinging upon the array frontside will either contact a particle directly to generate electric current or it will pass through the matrix and be reflected from the layer 7 until such ray impinges upon a particle, thereby generating additional electric current. The reflected light was mainly absorbed in locations other than the particles in the prior art systems, thereby wasting impinging energy and generating less electric current than in the above described embodiment.

Figure 2:
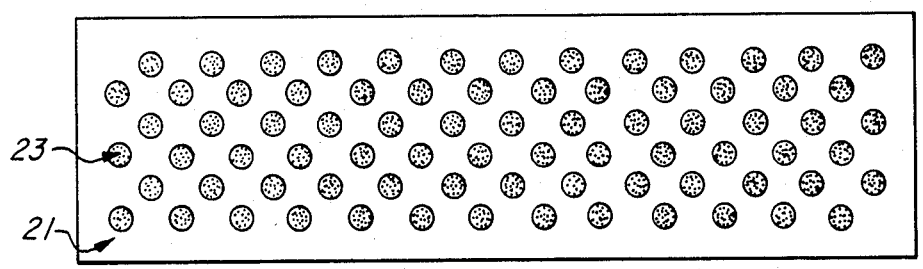
FIG. 2 is a top view of a flexible plastic backing with adhesive thereon for providing an ordered array of particles.

In the formation of the array shown in FIG. 1 by the techniques described in the above noted Kilby et al. patent, it is desirable that the particles 9 be arranged in an ordered manner rather than randomly in the matrix 1 with the best arrangement being a two-dimensional hexagonal close packed arrangement. One technique for accomplishing this result is shown in FIG. 2 wherein a flexible plastic backing such as Mylar 21 has adhesive dots 23 deposited thereon in an ordered form. The silicon particles 9 with a skin thereon are dropped onto the backing and stick to the adhesive dots. Those particles 9 which contact the dots 23 adhere thereto, the remainder being removed from the backing 21. A mixture of glass powder and binder is then poured onto the backing 21 between the particles, explained and shown in detail hereinbelow in reference to a further embodiment, and allowed to dry. Alternatively, the mixture of glass powder and binder may be spread in the form of a thin sheet on any suitable flat surface and the silicon particles held in place on their adhesive backing are transferred into this green glass sheet. The green glass sheet backing is stripped away leaving the particles in the glass which is then allowed to dry. The dried glass with particles therein is then flexible and solid. The backing 21 with adhesive 23 is removed and the glass and particle system is fired to drive off the binder and cause sintering of the glass to the particles to provide the rigid matrix with particles embedded therein.

Figure 3:
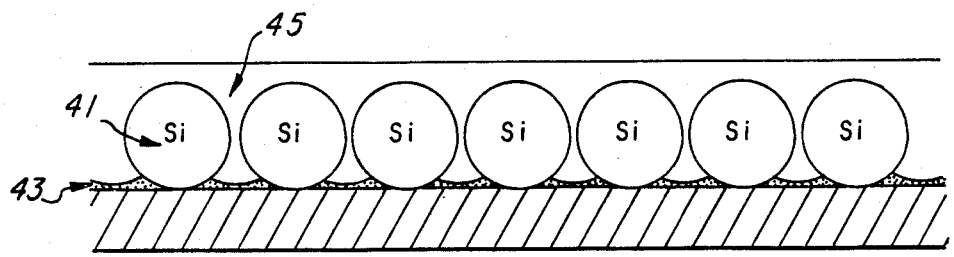
FIG. 3 is a second embodiment for providing an ordered array of particles.
Figure 4:
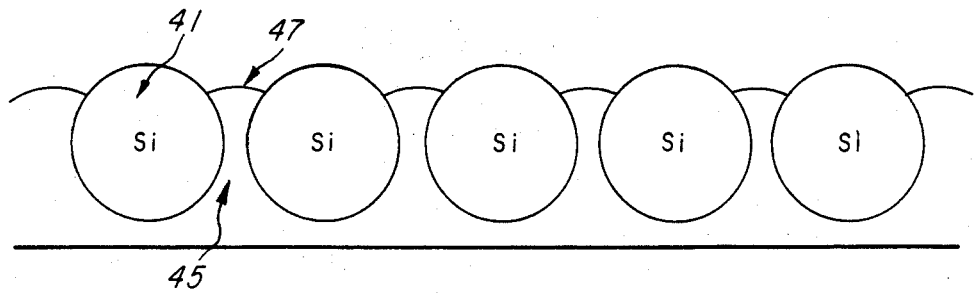
FIG. 4 is a cross-sectional view of a portion of a solar array using the embodiments of FIGS. 2 or 3.

Referring now to FIG. 3, there is shown a further embodiment for providing an ordered array of particles in the matrix. In this embodiment, the particles 41 are positioned in an ordered manner on a backing layer of ice or wax 43 which is heated sufficiently so that the particles adhere thereto. The backing layer 43 is then cooled so that it is solid and a glass slurry 45 of the type used in accordance with the embodiment of FIG. 2 is poured over the backing 43 and between the particles 41 and permitted to dry. The backing 43 is then removed by heating it to the melting point thereof and the glass-particle mixture is then fired as above. The resulting system is shown in FIG. 4 wherein the particles 41 extend above the glass on the side from which the backing was removed, that surface 47 of the glass being smooth. An interparticle connecting film deposited over this smooth glass surface will have the highest possible conductivity.

Figure 5:
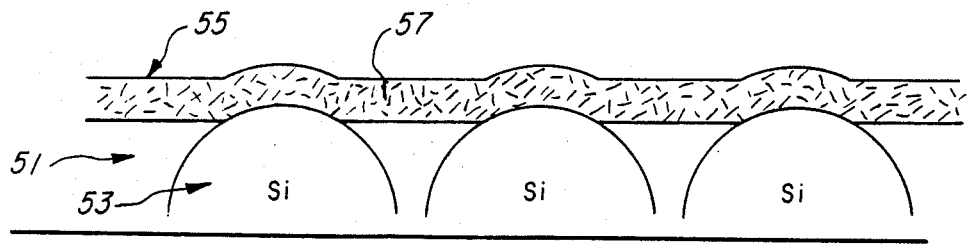
FIG. 5 is a cross-sectional view of a portion of a solar array with enhanced current carrying capability provided for the frontside conductors.

Referring now to FIG. 5, there is shown a structure for increasing the current flow in the frontside conductor. There is shown the glass matrix 51 having particles 53 embedded therein and a frontside conductor 55 having conductive whiskers 57 embedded therein. The conductive whiskers greatly increase the conductivity of the frontside conductors, the amount of increase depending upon the amount of conductive whiskers in the oxide conductors.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

What is claimed is:

1. A solar array for converting light to electrical energy, comprising:
   (a) an electrically insulating matrix having a pair of opposed surfaces,
   (b) a plurality of photovoltaic particles, each particle having a P-type region and an N-type region which form a junction, said particles being secured in said matrix, one of said regions extending to one of said surfaces and the other of said regions extending to the other of said surfaces, said junction extending to said matrix, and
   (c) means electrically interconnecting said regions of said particles extending to one of said surfaces, said means including a transparent electrically conductive layer disposed on said one surface and electrically conductive whiskers disposed in said electrically conductive layer.

2. A solar array as set forth in claim 1 wherein said electrically conductive layer is taken from the class consisting of tin oxide, indium oxide, and alloys of indium oxide and tin oxide.

3. A solar array as set forth in claim 1 wherein said whiskers are formed of metal.

4. A solar array as set forth in claim 2 wherein said whiskers are formed of metal.

* * * * *